(12) United States Patent
Chidambarrao et al.

(10) Patent No.: US 7,198,995 B2
(45) Date of Patent: Apr. 3, 2007

(54) STRAINED FINFETS AND METHOD OF MANUFACTURE

(75) Inventors: Dureseti Chidambarrao, Weston, CT (US); Omer H. Dokumaci, Wappingers Falls, NY (US); Oleg G. Gluschenkov, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 97 days.

(21) Appl. No.: 10/733,378

(22) Filed: Dec. 12, 2003

(65) Prior Publication Data

US 2005/0130358 A1     Jun. 16, 2005

(51) Int. Cl.
*H01L 21/84* (2006.01)

(52) U.S. Cl. .................. 438/157; 438/275; 438/285

(58) Field of Classification Search .............. 438/157, 438/275, 285
See application file for complete search history.

(56) References Cited

U.S. PATENT DOCUMENTS

| | | | |
|---|---|---|---|
| 3,602,841 A | 8/1971 | McGroddy | |
| 4,665,415 A | 5/1987 | Esaki et al. | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke | |
| 5,081,513 A | 1/1992 | Jackson et al. | |
| 5,108,843 A | 4/1992 | Ohtaka et al. | |
| 5,134,085 A | 7/1992 | Gilgen et al. | |
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |
| 5,459,346 A | 10/1995 | Asakawa et al. | |
| 5,471,948 A | 12/1995 | Burroughes et al. | |
| 5,557,122 A | 9/1996 | Shrivastava et al. | |
| 5,561,302 A | 10/1996 | Candelaria | |
| 5,565,697 A | 10/1996 | Asakawa et al. | |
| 5,571,741 A | 11/1996 | Leedy | |

(Continued)

FOREIGN PATENT DOCUMENTS

JP     64-76755     3/1989

OTHER PUBLICATIONS

Kern Rim, et al., "Transconductance Enhancement in Deep Submicron Strained-Si *n*-MOSFETs", International Electron Devices Meeting, 26, 8, 1, IEEE, Sep. 1998.

(Continued)

*Primary Examiner*—Richard A. Booth
(74) *Attorney, Agent, or Firm*—Joseph P. Abate, Esq.; Greenblum & Bernstein, P.L.C.

(57) ABSTRACT

A semiconductor structure and method of manufacturing is provided. The method of manufacturing includes forming shallow trench isolation (STI) in a substrate and providing a first material and a second material on the substrate. The first material and the second material form a first island and second island at an pFET region and a nFET region, respectively. A tensile hard mask is formed on the first and the second island layer prior to forming finFETs. An Si epitaxial layer is grown on the sidewalls of the finFETs with the hard mask, now a capping layer which is under tension, preventing lateral buckling of the nFET fin.

26 Claims, 7 Drawing Sheets

U.S. PATENT DOCUMENTS

| | | | |
|---|---|---|---|
| 5,592,007 A | 1/1997 | Leedy | |
| 5,592,018 A | 1/1997 | Leedy | |
| 5,670,798 A | 9/1997 | Schetzina | |
| 5,679,965 A | 10/1997 | Schetzina | |
| 5,683,934 A | 11/1997 | Candelaria | |
| 5,840,593 A | 11/1998 | Leedy | |
| 5,861,651 A | 1/1999 | Brasen et al. | |
| 5,880,040 A | 3/1999 | Sun et al. | |
| 5,940,716 A | 8/1999 | Jin et al. | |
| 5,940,736 A | 8/1999 | Brady et al. | |
| 5,946,559 A | 8/1999 | Leedy | |
| 5,960,297 A | 9/1999 | Saki | |
| 5,981,356 A | 11/1999 | Hsueh et al. | |
| 5,989,978 A | 11/1999 | Peidous | |
| 6,008,126 A | 12/1999 | Leedy | |
| 6,025,280 A | 2/2000 | Brady et al. | |
| 6,046,464 A | 4/2000 | Schetzina | |
| 6,066,545 A | 5/2000 | Doshi et al. | |
| 6,080,637 A | 6/2000 | Huang et al. | |
| 6,090,684 A | 7/2000 | Ishitsuka et al. | |
| 6,093,621 A | 7/2000 | Tseng | |
| 6,107,143 A | 8/2000 | Park et al. | |
| 6,117,722 A | 9/2000 | Wuu et al. | |
| 6,133,071 A | 10/2000 | Nagai | |
| 6,165,383 A | 12/2000 | Chou | |
| 6,221,735 B1 | 4/2001 | Manley et al. | |
| 6,228,694 B1 | 5/2001 | Doyle et al. | |
| 6,246,095 B1 | 6/2001 | Brady et al. | |
| 6,255,169 B1 | 7/2001 | Li et al. | |
| 6,261,964 B1 | 7/2001 | Wu et al. | |
| 6,265,317 B1 | 7/2001 | Chiu et al. | |
| 6,274,444 B1 | 8/2001 | Wang | |
| 6,281,532 B1 | 8/2001 | Doyle et al. | |
| 6,284,623 B1 | 9/2001 | Zhang et al. | |
| 6,284,626 B1 | 9/2001 | Kim | |
| 6,319,794 B1 | 11/2001 | Akatsu et al. | |
| 6,361,885 B1 | 3/2002 | Chou | |
| 6,362,082 B1 | 3/2002 | Doyle et al. | |
| 6,368,931 B1 | 4/2002 | Kuhn et al. | |
| 6,403,486 B1 | 6/2002 | Lou | |
| 6,403,975 B1 | 6/2002 | Brunner et al. | |
| 6,406,973 B1 | 6/2002 | Lee | |
| 6,413,802 B1* | 7/2002 | Hu et al. | 438/151 |
| 6,461,936 B1 | 10/2002 | von Ehrenwall | |
| 6,476,462 B2 | 11/2002 | Shimizu et al. | |
| 6,483,171 B1 | 11/2002 | Forbes et al. | |
| 6,493,497 B1 | 12/2002 | Ramdani et al. | |
| 6,498,358 B1 | 12/2002 | Lach et al. | |
| 6,501,121 B1 | 12/2002 | Yu et al. | |
| 6,506,652 B2 | 1/2003 | Jan et al. | |
| 6,509,618 B2 | 1/2003 | Jan et al. | |
| 6,521,964 B1 | 2/2003 | Jan et al. | |
| 6,531,369 B1 | 3/2003 | Ozkan et al. | |
| 6,531,740 B2 | 3/2003 | Bosco et al. | |
| 6,583,060 B2 | 6/2003 | Trivedi | |
| 6,717,216 B1 | 4/2004 | Doris et al. | |
| 6,803,631 B2* | 10/2004 | Dakshina-Murthy et al. | 257/349 |
| 6,825,529 B2 | 11/2004 | Chidambarrao et al. | |
| 6,831,292 B2 | 12/2004 | Currie et al. | |
| 6,852,576 B2* | 2/2005 | Lin et al. | 438/151 |
| 6,974,981 B2 | 12/2005 | Chidambarrao et al. | |
| 6,977,194 B2 | 12/2005 | Belyansky et al. | |
| 7,015,082 B2 | 3/2006 | Doris et al. | |
| 2001/0009784 A1 | 7/2001 | Ma et al. | |
| 2002/0063292 A1 | 5/2002 | Armstrong et al | |
| 2002/0074598 A1 | 6/2002 | Doyle et al. | |
| 2002/0086472 A1 | 7/2002 | Roberds et al. | |
| 2002/0086497 A1 | 7/2002 | Kwok | |
| 2002/0090791 A1 | 7/2002 | Doyle et al. | |
| 2003/0032261 A1 | 2/2003 | Yeh et al. | |
| 2003/0040158 A1 | 2/2003 | Saitoh | |
| 2003/0057184 A1 | 3/2003 | Yu et al. | |
| 2003/0067035 A1 | 4/2003 | Tews et al. | |
| 2004/0238914 A1 | 12/2004 | Deshpande et al. | |
| 2004/0262784 A1 | 12/2004 | Doris et al. | |
| 2005/0040460 A1 | 2/2005 | Chidambarrao et al. | |
| 2005/0048727 A1* | 3/2005 | Maszara et al. | 438/285 |
| 2005/0082634 A1 | 4/2005 | Doris et al. | |
| 2005/0093030 A1 | 5/2005 | Doris et al. | |
| 2005/0098829 A1 | 5/2005 | Doris et al. | |
| 2005/0106799 A1 | 5/2005 | Doris et al. | |
| 2005/0145954 A1 | 7/2005 | Zhu et al. | |
| 2005/0148146 A1 | 7/2005 | Doris et al. | |
| 2005/0161711 A1* | 7/2005 | Chu | 257/288 |
| 2005/0194699 A1 | 9/2005 | Belyansky et al. | |
| 2005/0236668 A1 | 10/2005 | Zhu et al. | |
| 2005/0245017 A1 | 11/2005 | Belyansky et al. | |
| 2005/0280051 A1 | 12/2005 | Chidambarrao et al. | |
| 2005/0282325 A1 | 12/2005 | Belyansky et al. | |
| 2006/0027868 A1 | 2/2006 | Doris et al. | |
| 2006/0057787 A1 | 3/2006 | Doris et al. | |
| 2006/0060925 A1 | 3/2006 | Doris et al. | |

OTHER PUBLICATIONS

Kern Rim, et al., "Characteristics and Device Design of Sub-100 nm Strained Si N- and PMOSFETs", 2002 Symposium On VLSI Technology Digest of Technical Papers, IEEE, pp 98-99.

Gregory Scott, et al., "NMOS Drive Current Reduction Caused by Transistor Layout and Trench Isolation Induced Stress", Internatioal Electron Devices Meeting, 34.4.1, IEEE, Sep. 1999.

F. Ootsuka, et al., "A Highly Dense, High-Performance 130nm node CMOS Technology for Large Scale System-on-a-Chip Application", International Electron Devices Meeting, 23.5.1, IEEE, Apr. 2000.

Shinya ito, et al., "Mechanical Stress Effect of Etch-Stop Nitride and its Impact on Deep Submicron Transistor Design", International Electron Devices Meeting, 10.7.1, IEEE, Apr. 2000.

A. Shimizu, et al., "Local Mechanical-Stress Control (LMC): A New Technique for CMOS-Performance Enhancement", International Electron Devices Meeting, IEEE, Mar. 2001.

K. Ota, et al., "Novel Locally Strained Channel Technique for high Performance 55nm CMOS", International Electron Devices Meeting, 2.2.1, IEEE, Feb. 2002.

G. Zhang, et al., "A New 'Mixed-Mode' Reliability Degradation Mechanism in Advanced Si and SiGe Bipolar Transistors." IEEE Transactions on Electron Devices, vol. 49, No. 12, Dec. 2002, pp. 2151-56.

H.S. Momose, et al., "Temperature Dependence of Emitter-Base Reverse Stress Degradation and its Mechanism Analyzed by MOS Structures," 1989 IEEE, Paper 6.2, pp. 140-143.

C.J. Huang, et al., "Temperature Dependence and Post-Stress Recovery of Hot Electron Degradation Effects in Bipolar Transistors." IEEE 1991, Bipolar Circuits and Technology Meeting 7.5, pp. 170-173.

S.R. Sheng, et al., "Degradation and Recovery of SiGe HBTs Following Radiation and Hot-Carrier Stressing," pp. 14-15.

Z. Yang, et al., "Avalanche Current Induced Hot Carrier Degradation in 200 GHz SiGe Heterojunction Bipolar Transistors." pp. 1-5.

H. Li, et al., "Design of W-Band VCOs with High Output Power for Potential Application in 77 GHz Automotive Radar Systems." 2003, IEEE GaAs Digest, pp. 263-266.

H. Wurzer, et al., "Annealing of Degraded non-Transistors-Mechanisms and Modeling," IEEE Transactions on Electron Devices, vol. 41, No. 4, Apr. 1994, pp. 533-538.

B. Doyle: et al., "Recovery of Hot-Carrier Damage in Reoxidized Nitrided Oxide Mosfets." IEEE Electron Device Letters, vol. 13, No. 1, Jan. 1992, pp. 38-40.

H.S. Momose, et al., "Analysis of the Temperature Dependence of Hot-Carrier-Induced Degradation in Bipolar Transistors for Bi-CMOS." IEEE Transactions on Electron Devices, vol.. 41, No. 6, Jun. 1994, pp. 978-987.

M. Khater, et al., "SiGe HBT Technology with Fmax/Ft = 350/300 GHz and Gate Delay Below 3.3 ps" 2004 IEEE, 4 pages.

J.C. Bean, et al. "GEx SI I-x/Si Strained-Layer Superlattice Grown by Molecular Beam Epitaxy", J. Vac. Sci. Technol. A 2(2), Apr.-Jun. 1984, pp. 436-440.

J.H. Van Der Merwe, "Regular Articles", Journal of Applied Physics, vol. 34, No. 1, Jan. 1963, pp. 117-122.

J.W. Matthew, et al., "Defects in Epitaxial Multilayers" Journal of Crystal Growth 27 (1974), pp. 118-125.

Subramanian S. Iyer, et al. "Heterojuction Bipolar Transistors Using Si-Ge Alloys". IEEE Tranactions on Electron Devices, vol. 36, No. 10, Oct. 1989, pp. 2043-2064.

R.H.M. Van De Leur, et al., "Critical Thickness for Pseudomorphic Growth of Si/Ge Alloys and Superlattices". J. Appl. Phys. 64 (6), Sep. 15, 1988, pp. 3043-3050.

D.C. Houghton et al., "Equilibrum Critical Thickness for SI I-x GEx Strained Layers on (100) Si" Appl. Phys. Lett. 56 (5), Jan. 29, 1990, pp. 460-462.

Q. Quyang et al., "Two-Dimensional Bandgap Engineering in a Novel Si/SiGe pmosfet with Enhanced Device Performance and Scalability" 2000, IEEE, pp. 151-154.

* cited by examiner

STRAINED FINFETS AND METHOD OF MANUFACTURE

BACKGROUND OF THE INVENTION

1. Field of the Invention

The invention generally relates to a semiconductor device and method of manufacture and, more particularly, to the fabrication of finFETs of a semiconductor device with tensile and compressive stresses.

2. Background Description

Mechanical stresses within a semiconductor device substrate can modulate device performance. That is, stresses within a semiconductor device are known to enhance semiconductor device characteristics. Thus, to improve the characteristics of a semiconductor device, tensile and/or compressive stresses are created in the channel of the n-type devices (e.g., nFETs) and/or p-type devices (e.g., pFETs). However, the same stress component, either tensile stress or compressive stress, discriminatively affects the characteristics of an n-type device and a p-type device.

In order to maximize the performance of both nFETs and pFETs within integrated circuit (IC) chips, the stress components should be engineered and applied differently for nFETs and pFETs. That is, because the type of stress which is beneficial for the performance of an nFET is generally disadvantageous for the performance of the pFET. More particularly, when a device is in tension (e.g., in the direction of current flow in a planar device), the performance characteristics of the nFET are enhanced while the performance characteristics of the pFET are diminished. To selectively create tensile stress in an nFET and compressive stress in a pFET, distinctive processes and different combinations of materials are used.

For example, a trench isolation structure has been proposed for forming the appropriate stresses in the nFETs and pFETs, respectively. When this method is used, the isolation region for the nFET device contains a first isolation material which applies a first type of mechanical stress on the nFET device in a longitudinal direction (e.g., parallel to the direction of current flow) and in a transverse direction (e.g., perpendicular to the direction of current flow). Further, a first isolation region and a second isolation region are provided for the pFET and each of the isolation regions of the pFET device applies a unique mechanical stress on the pFET device in the transverse and longitudinal directions.

Alternatively, liners on gate sidewalls have been proposed to selectively induce the appropriate stresses in the channels of the FET devices (see, Ootsuka et al., IEDM 2000, p.575, for example). By providing liners, the appropriate stress is applied closer to the device than the stress applied as a result of the trench isolation fill technique.

Also, there have been many proposals to improve both nFET and pFET device performance using tensile and compressive stresses, respectively, which include modulating spacer intrinsic stresses and STI (shallow trench isolation) material changes individually for two MOSFETs using masks. Tensilely strained Si on relaxed SiGe has also been proposed as a means to apply this stress. Unfortunately, the tensilely strained Si on relaxed SiGe can apply only biaxial tensile stress on the Si cap as used in stack form. This constrains the regime of Ge % that is useful because of the nature of pFET sensitivity to stress. The nFET performance monotonically improves with biaxial tension; however, the pFET is degraded with biaxial tension until about 3 GPa at which point it begins to improve.

In order to improve both the pFET and nFET simultaneously, the Ge % needs to be high, approximately greater than 25–30% (or equivalent to approximately greater than 3–4 GPa in stress). This level of Ge % is difficult to implement into processes and is not very manufacturable with major issues including surface roughness, process complexity, defect and yield control, to name but a few. Given that a high Ge % is hard to use for the pFET (since it would be detrimental because of the relatively low levels of tension), other methods must be devised to improve the device performance.

Additionally, Si:C is know to grow epitaxially on Si where it is inherently tensile. A 1% C content in the Si:C/Si material stack can cause tensile stress levels in the Si:C on the order of 500 MPa. In comparison, in the SiGe/Si system about 6% is needed to cause a 500 MPa compression. This 1% level of C can be incorporated into Si during epitaxial growth as shown in Ernst et al., VLSI Symp., 2002, p. 92. In Ernst, the Si/Si:C/Si is in a layered channel for nFETs. However, the Si:C part of the structure is not relaxed. Instead, in Ernst, an unrelaxed Si:C is used as part of the channel, itself, with a very thin Si cap. The problem with this approach is that the mobility is not enhanced, but retarded, depending on the C content, from scattering.

While these methods do provide structures that have tensile stresses being applied to the nFET device and compressive stresses being applied along the longitudinal direction of the pFET device, they may require additional materials and/or more complex processing, and thus, resulting in higher cost. Further, the level of stress that can be applied in these situations is typically moderate (i.e., on the order of 100s of MPa). Thus, it is desired to provide more cost-effective and simplified methods for creating large tensile and compressive stresses in the channels nFETs and pFETs, respectively.

SUMMARY OF THE INVENTION

In a first aspect of the invention, a method of manufacturing a structure includes forming a first island of material having a first lattice constant and a second island of material having a second lattice constant. A mask is provided over the first island and the second island to prevent future buckling when sidewalls are grown on the fins. The mask is in tensile stress. A first finFET and a second finFET are formed from the first island and the second island and the mask.

In another aspect, a method of manufacturing a structure includes forming shallow trench isolation (STI) in a substrate with a first material and forming a first island associated with a pFET region and a second material forming a second island associated with an nFET region. A hard mask under tension is formed over the pFET region and the nFET region, which is used to form pFET fin and an nFET fin with a capping layer of the hard mask in the pFET region and the nFET region, respectively. Epitaxial silicon sidewalls are grown on the pFET fin and the nFET fin, where the capping layer prevents buckling of the nFET fin during the formation of the sidewall.

In another aspect of the invention, a semiconductor structure includes a substrate and a relaxed shallow trench isolation (STI) in the substrate. A first finFET comprised of a first material having a first lattice constant and a cap of highly tensile material is provided. A second finFET comprised of a second material having a second lattice constant and a cap of highly tensile material is also provided. A Si epitaxially grown sidewall is provided on the first finFET and the second finFET. The cap of highly tensile material on the second finFET prevents lateral buckling of the second finFET when the Si epitaxial sidewall is grown.

DETAILED DESCRIPTION OF EMBODIMENTS OF THE INVENTION

Figure 1:
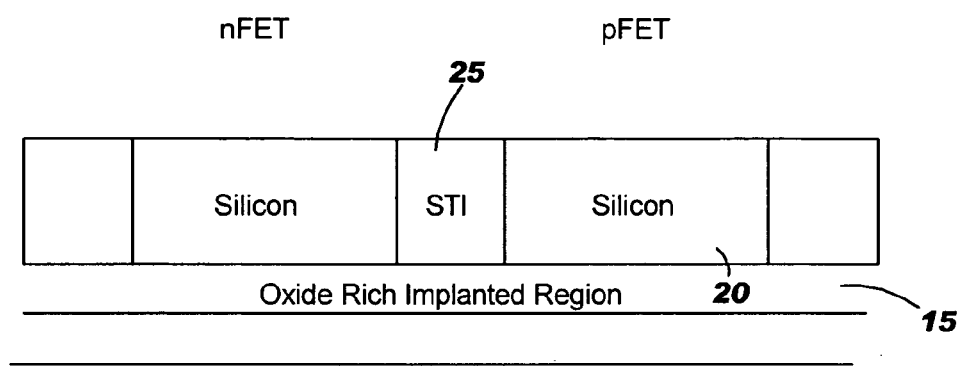
FIGS. 1 through 6 represent a fabrication process to form an intermediate structure in accordance with the invention.

This invention is directed to a semiconductor device and method of manufacture which provides desired stresses associated with the nFET and the pFET of CMOS devices for improved device performance. In one approach, SiGe and Si:C islands are obtained in the respective nFET and pFET channels prior to the formation of finFETs. Thereafter a tensile film is formed on the islands. This tensile film, e.g., hard mask, provides a significant amount of lateral stiffness and holds the Si:C fin in place. That is, the tensile hard mask prevents the fin, which is under a highly compressive stress, from buckling, laterally, due in part to asymmetries in the fin expected to form during processing. An epitaxial Si layer is then formed on both relaxed nFET and pFET fins to provide the desired stress conditions of the nFET and the pFET.

A finFET is a double-gate structure, where the silicon body has been turned on its side to form a "fin" of silicon standing perpendicular to the wafer plane. The gate electrode is formed on both sides of the fin, allowing simultaneous definition of both gates with a single mask level and etch. The fin, as implemented in the invention, is preferably symmetrical with a double gate, but may be asymmetrical with a single gate. It should further be recognized that the finFET provides higher drive-current density without requiring gate oxide thickness reduction and its associated leakage by simply adjusting the dimensions of the fins. In the invention, the finFETs are obtained in a relative stress state, which improves the performance of the device.

Prior to the invention, placement of at least two crystal islands for the fabrication of nFETs and pFETs with different relaxed crystal lattice (different dimensions between the atoms) was only feasible by wafer bonding techniques where the islands have a relatively large size; however, in the invention, the methods yield a unique substrate with small crystal islands which have a relaxed but different crystal structure. In one implementation, the use of high temperature stable amorphous material, e.g., SiO$_2$, between the islands and the crystal on insulator structure is provided. The unique structure with different (crystal) islands allows for the placement of differently strained layers of optionally different crystals. In a first aspect, the differently strained layers are a tensile SiGe layer or a compressive Si:C layer used to from the finFETs of the invention.

The invention has a seminal and important contribution to the art of making substrates with islands on insulator with multiple crystal lattice constants. In the invention, for example, a first finFET (crystal 1) has a lattice constant a $\geq$ aSi and the second finFET (crystal 2) has a lattice constant a $\leq$ aSi. In one aspect of the invention, as discussed in greater detail below, a Si epitaxial sidewall layer of the invention can be selectively grown, which will strain tensilely and compressively on the SiGe finFET and Si:C finFeT, respectively.

Referring now to FIG. 1, a silicon wafer is shown. Such wafers are commercially available starting substrates for various discrete and integrated circuit (IC) semiconductor device applications. In one implementation, silicon on glass (SOI) wafer may be fabricated using the SIMOX ( Separation by IMplanted OXgen) process, which employs high dose ion implantation of oxygen and high temperature annealing to form a BOX (buried oxide) layer in a bulk wafer. As another example, the wafer can be fabricated by bonding a device quality silicon wafer to another silicon wafer (the substrate layer) that has an oxide layer on its surface. The pair is then split apart, using a process that leaves a thin (relative to the thickness of the starting wafer), device-quality layer of single crystal silicon on top of the oxide layer (which has now become the BOX) on the substrate layer. The SOI wafer may also be formed using other processes.

Still referring to FIG. 1, an Si layer 20 is formed and patterned to form shallow trench isolation (STI) 25 using standard techniques of pad oxidation, pad nitride deposition, lithography based patterning, reactive ion etching (RIE) of the stack consisting of nitride, oxide, and silicon down to the buried oxide, edge oxidation, liner deposition, fill deposition, and chemical mechanical polish. The STI formation process is well known in the art. In one implementation, high temperature stable amorphous material, e.g., SiO$_2$, is used for the STI.

Figure 2:
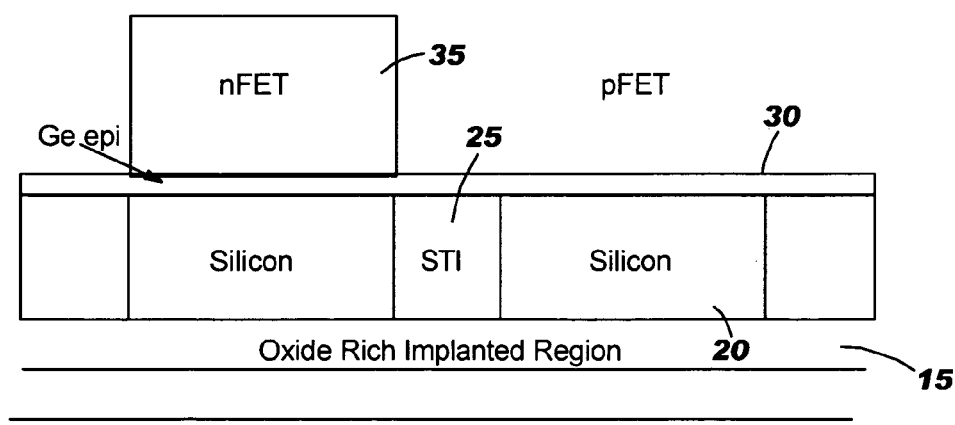

Referring to FIG. 2, an epitaxial Ge material (layer) 30 is deposited over the surface of the structure using conventional techniques such as chemical vapor deposition methods. For example, ultrahigh vacuum chemical vapor deposition (UHVCVD) may be used in a conventional manner to deposit the Ge layer 30. Other conventional techniques include rapid thermal chemical vapor deposition (RTCVD), limited reaction processing CVD (LRPCVD) and molecular beam epitaxy (MBE). In one embodiment, the thickness of the Ge material may range from 5 to 50 nanometers, or other dimension depending on the thickness of the underlying Si layer which may, for example, range from 30 to 100 nanometers.

An nFET hard mask 35 is provided on a portion of the Ge layer 30 (e.g., at locations of a yet to be formed nFET device). The nFET hard mask 35 may be a nitride hard mask formed using a conventional deposition process such as spin-on coating, CVD, plasma-assisted CVD, ultrahigh vacuum chemical vapor deposition (UHVCVD), rapid thermal chemical vapor deposition (RTCVD), limited reaction processing CVD (LRPCVD) and other like deposition processes.

Figure 3:
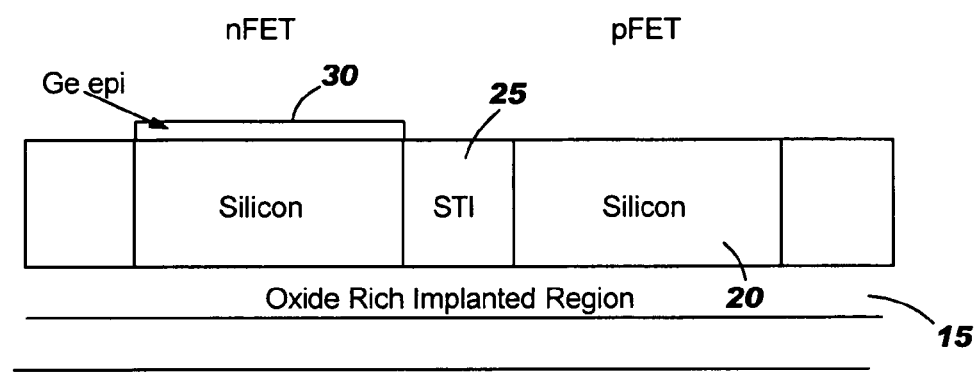

In FIG. 3, the exposed Ge layer 30 is etched and the nFET mask 35 is stripped using techniques known in the art. For example, the Ge layer 30 may be selectively etched using RIE, wet or dry etching.

Figure 4:
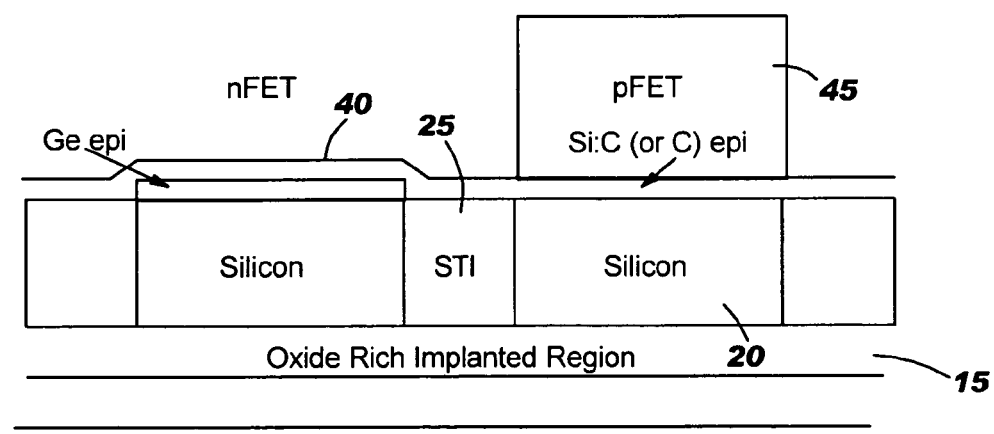

As shown in FIG. 4, a Si:C material 40 (or optionally C) is deposited on the structure, including over the epitaxially deposited Ge material 35. For example, ultrahigh vacuum chemical vapor deposition (UHVCVD) may be used in a conventional manner to deposit the Si:C (or optionally C) material 40. Other conventional techniques include rapid thermal chemical vapor deposition (RTCVD), limited reaction processing CVD (LRPCVD) and other like processes. In one embodiment, the thickness of the Si:C or C material may range from 5 to 50 nanometers, or other dimension depending on the thickness of the underlying Si layer which may, for example, range from 30 to 100 nanometers. In another aspect, when using C, the thickness may range from 1 to 30 nanometers.

A pFET hard mask 45 is provided on a portion of the Si:C material 40 at locations of the yet to be formed pFET. The pFET hard mask 45 may be a nitride hard mask formed using a conventional deposition process such as spin-on coating, CVD, plasma-assisted CVD, ultrahigh vacuum chemical vapor deposition (UHVCVD), rapid thermal chemical vapor deposition (RTCVD), limited reaction processing CVD (LRPCVD) and other like deposition processes.

Figure 5:
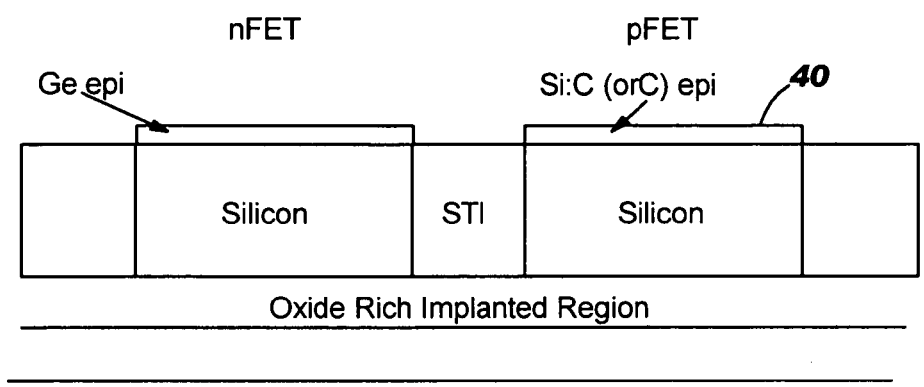

As shown in FIG. 5, the exposed Si:C layer 40 is then etched and the pFET mask 45 is stripped using techniques known in the art. For example, the Si:C and pFET may be etched using standard etching techniques such as, for example, RIE, wet or dry etching and the like.

Figure 6:
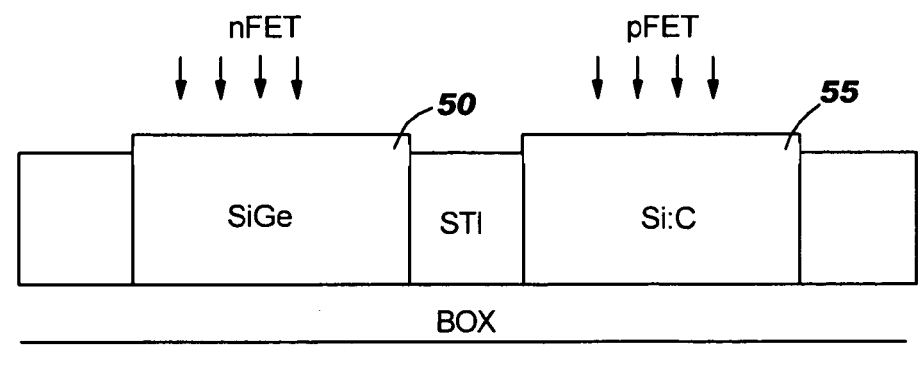

In FIG. 6, the structure then undergoes a thermal annealing process. During this process, for the nFET device, the deposited Ge material 30 is mixed into the underlying SOI film to form an island 50 of substantially SiGe material. Similarly, in this process, for the pFET, the deposited Si:C or optional C material is mixed into the underlying SOI film forming an island 55 of substantially Si:C material. The thermal annealing process takes place, for example, at about 1200° C. to 1350° C. between 1 hour and 10 hours, with one implementation at 1200° C. for approximately 5 hours.

By using the method of the invention, the required Ge % is not large (e.g., less than 25% and in one implementation 10 to 20%) for the nFET and thus does not cause defect issues. Also, due to the high temperature thermal mixing step, for example, the STI 25 can relax and facilitate the relaxation of the SiGe island 50 and Si:C island 55. This is due, in part, because the STI comprises oxide material, which is a viscous material at the high temperature, e.g., becomes a low viscosity material at high temperature.

Also, it should now be understood that the SiGe island 50 and the Si:C island 55 have different relaxed crystal lattice (different dimensions between the atoms) which yield a unique substrate with small crystal islands. The relaxation of the SiGe island 50 and the Si:C island 55 provides improved performance as compared to blanket (SiGe or Si:C) substrates. In an implementation, high temperature stable amorphous material, e.g., $SiO_2$, between the SiGe island 50 and the Si:C island 55 and the crystal on insulator structure are thus used in accordance with the invention.

Figure 7:
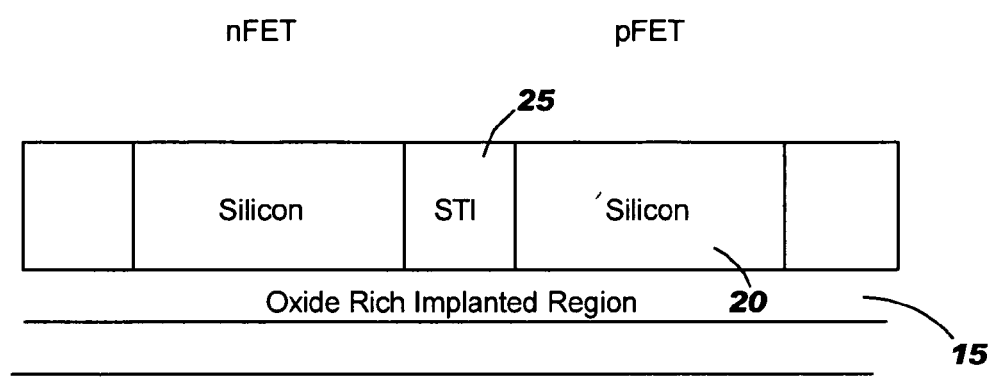
FIGS. 7 through 10 represent a fabrication process to form an intermediate structure in accordance with another aspect of the invention.

FIGS. 7–10 show another aspect of the invention. In FIG. 7, a silicon wafer such as SOI is shown. As in the previously described structure, the SOI may be fabricated using the SIMOX process or other well known processes. An Si layer 20 is patterned to form shallow trench isolation (STI) 25 using standard techniques of pad oxidation, pad nitride deposition, lithography based patterning, reactive ion etching (RIE) of the stack consisting of nitride, oxide, and silicon down to the buried oxide, edge oxidation, liner deposition, fill deposition, and chemical mechanical polish. The STI formation process is well known in the art.

Figure 8:
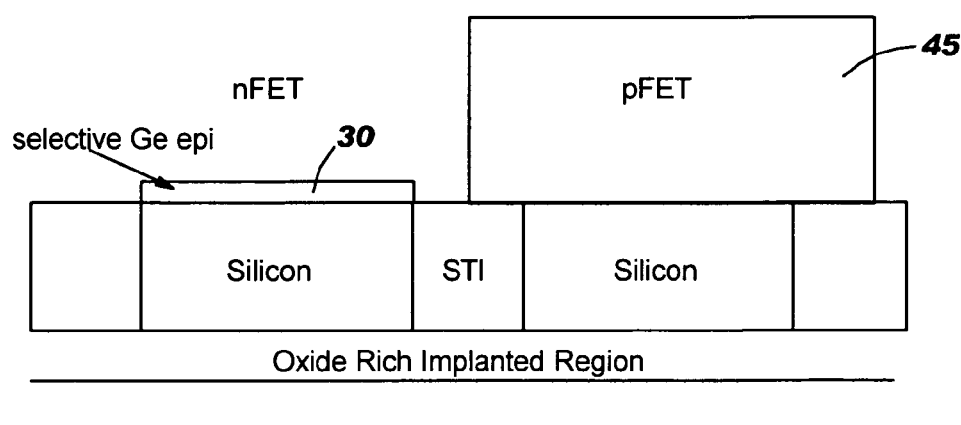

Referring to FIG. 8, a pFET mask 40 is provided on a portion of the structure at locations of the yet to be formed pFET. The pFET hard mask may be deposited using convention techniques such as chemical vapor deposition methods. For example, such techniques may include spin-on coating, CVD, plasma-assisted CVD, evaporation ultrahigh vacuum chemical vapor deposition (UHVCVD), rapid thermal chemical vapor deposition (RTCVD), limited reaction processing CVD (LRPCVD) and other like deposition processes.

An epitaxial Ge layer 30 is selectively grown over the exposed surface of the yet to be formed nFET using conventional techniques. In one embodiment, the thickness of the Ge material may range from 5 to 50 nanometers, or other dimension depending on the thickness of the underlying Si layer which may, for example, range from 30 to 100 nanometers. The hard mask 45 is stripped using well known processes, as discussed above.

Figure 9:
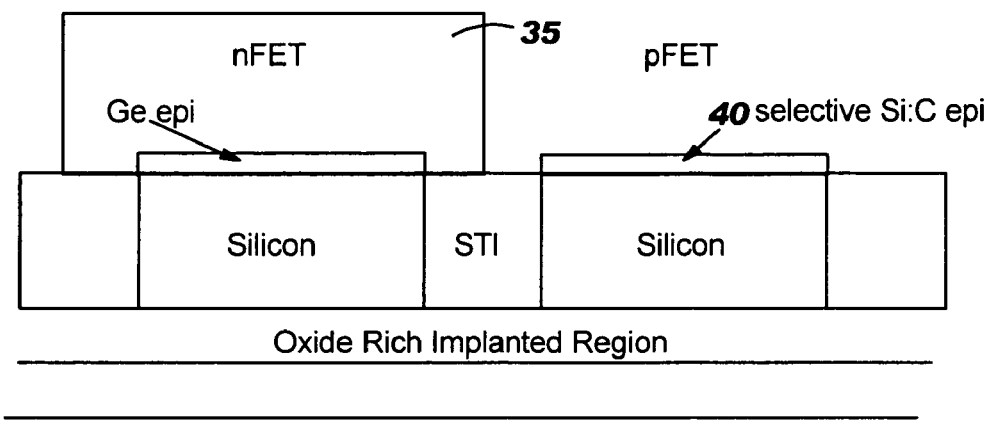

In FIG. 9, an nFET mask 35 is provided on a portion of the structure at locations of the yet to be formed nFET. The nFET hard mask may be deposited using conventional techniques such as chemical vapor deposition methods as discussed throughout and which should be known to those of ordinary skill.

An Si:C layer 40 is selectively grown over the exposed surface of the structure at the yet to be formed pFET using conventional techniques such as chemical vapor deposition method, as discussed above. In one embodiment, the thickness of the Si:C material may range from 5 to 50 nanometers, or other dimension depending on the thickness of the underlying Si layer which may, for example, range from 30 to 100 nanometers. The C may even be thinner ranging from 1 to 50 nanometers.

Figure 10:
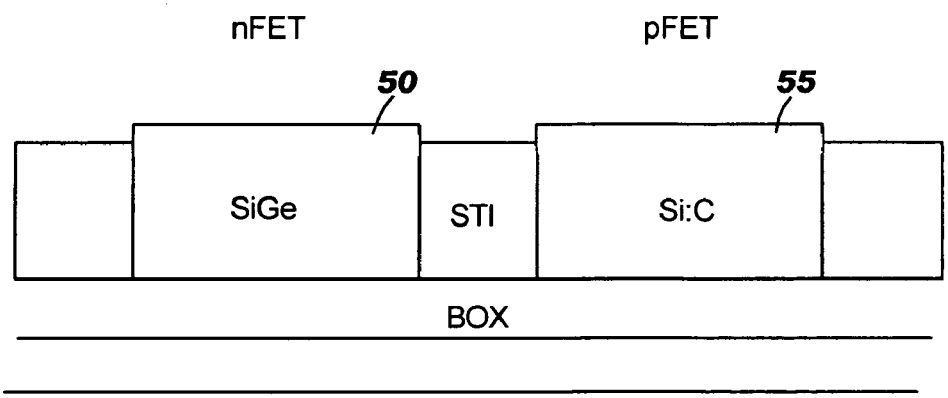

As shown in FIG. 10, the nFET hard mask 35 is then removed using well known processes. The structure then undergoes a thermal annealing process. During the annealing process, for the nFET device, the Ge material 30 is mixed into the SOI film forming an island 50 of substantially SiGe material. Similarly, for the pFET, the Si:C or optionally C material is mixed into the SOI film forming an island 55 of substantially Si:C material. This process also forms a BOX layer, as the substrate. The thermal annealing process takes place, for example, at about 1200° C. to 1350° C. between 1 hour and 10 hours, with one implementation at 1200° C. for approximately 5 hours.

As discussed above, and similar to the previous implementations, by using the method of the invention, the required Ge % is not large (e.g., less than 25% and in one implementation from 10 to 20%) and thus does not cause defect issues. Also, due to the high temperature thermal mixing, for example, the STI 25 can relax and facilitate the relaxation of the SiGe island 50 and Si:C island 55. As previously discussed, the relaxation of SiGe and Si:C provides improved performance as compared to blanket (SiGe or Si:C) substrates. In one implementation of the invention, the element of such structure is the use of high temperature stable amorphous material, e.g., $SiO_2$, between the islands and the crystal on insulator structure.

In another aspect of the invention, C can be implanted at high dose into the pFET region which can produce concentrations much greater than the 1–4% C in the Si:C upon thermal annealing. The dose may be about $1 \text{ e } 16 \text{ \#/cm}^2$ or greater such as $5 \text{ e } 16 \text{ \#/cm}^2$.

Figure 11:
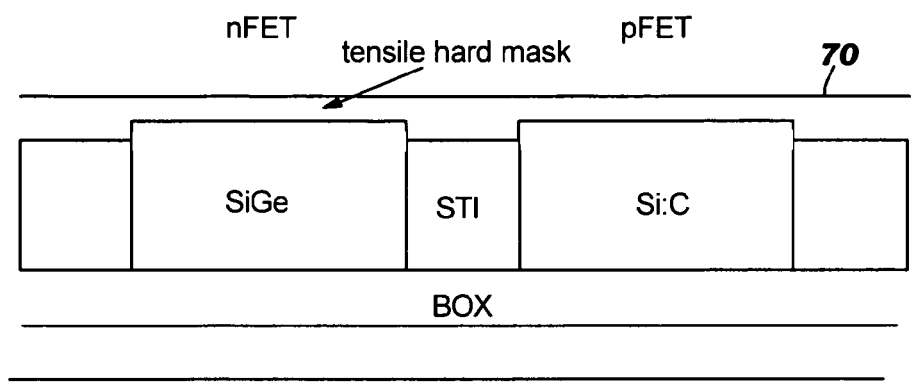
FIGS. 11–13 show fabrication processes to form an intermediate structure of the invention using either of the structures of FIG. 6 or FIG. 10, as a base, in accordance with the invention.

Now, using either of the intermediate structures of FIG. 6 or FIG. 10, a tensile hard mask is deposited on the structure as shown in FIG. 11. In one implementation, the hard mask is nitride, and is deposited in any known conventional manner over the structure. For example, the nitride hard mask may be hard mask formed using a conventional deposition process such as spin-on coating, CVD, plasma-assisted CVD, ultrahigh vacuum chemical vapor deposition (UHVCVD), rapid thermal chemical vapor deposition (RTCVD), limited reaction processing CVD (LRPCVD) and other like deposition processes. In one implementation, the hard mask is deposited to a range from 5 to 50 nanometers, or other dimension depending on the thickness of the underlying layers.

Figure 12:
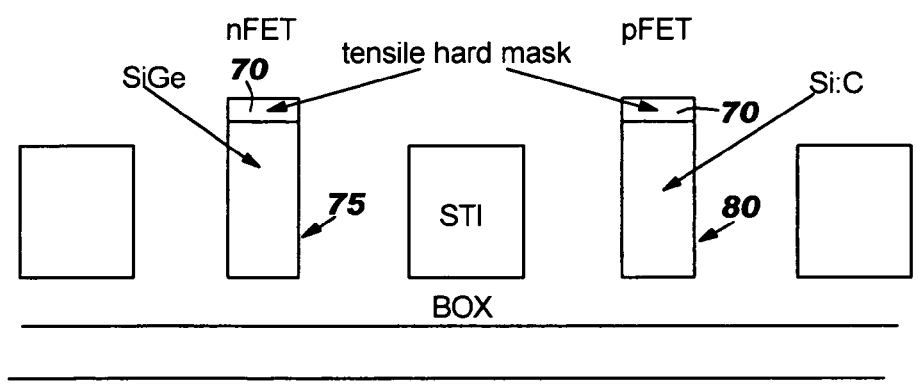

Thereafter, as shown in FIG. 12, a sidewall image transfer and etch is performed in a conventional manner to form the fins 75 and 80. For example, the fins are defined by Sidewall-Image Transfer Lithography, which places fins on the perimeter of drawn rectangles (mandrels). Subsequently a trim mask is used to remove undesired parts of loops and a conventional resist mask is used to block off source and drain regions (not shown) to link the fins together. During this process, the hard mask 70 remains as a cap of the nFET and pFET regions.

Figure 13:
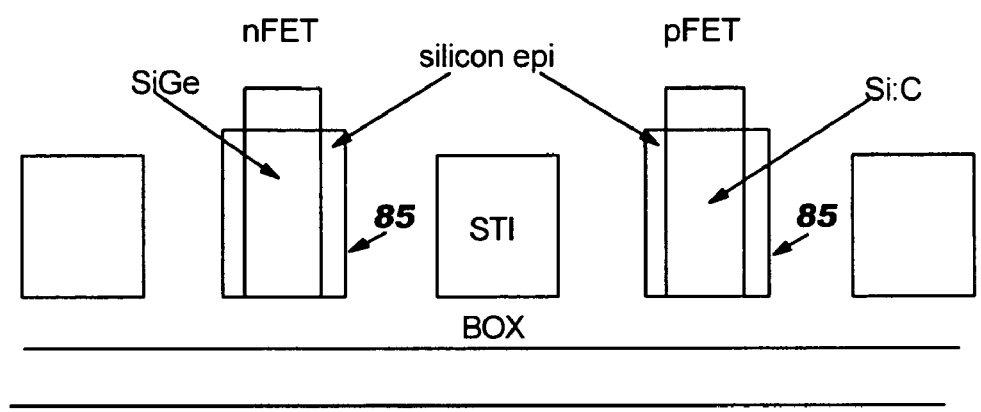

In FIG. 13, an Si epi layer 85 is selectively grown on the sidewalls of the nFET and the pFET. The Si epi layer may grow asymmetrically thus possibly inducing buckling in the nFET due to its highly compressive state, as discussed below. However, the highly tensile hard mask will ensure and even prevent such buckling by substantially equalizing the forces acting on the nFET region during the Si growth.

It should be understood that the lattice constant of the Si epi sidewall layer is different than that of the SiGe and the Si:C "islands" or etched fins. For example, in implementation, the SiGe has a lattice constant $a \geq aSi$ and the Si:C has a lattice constant $a \leq aSi$. That is, standing alone, the Si normally has a lower lattice constant than the SiGe layer; namely, the lattice constant of the Si material does not match the lattice constant of the SiGe layer. However, in the structure of the invention, the lattice structure of the Si sidewall layer will tend to match the lattice structure of the SiGe. Thus, by virtue of the lattice matching of the Si (which normally is smaller) to the SiGe layer, the Si layer is placed under a tensile stress. This area will act as a strained channel for the nFET. In one embodiment, the Ge content of the SiGe layer may be less than 25% in ratio to the Si content.

Also, standing alone, Si would normally have a larger lattice constant than the Si:C. That is, the lattice constant of the Si material does not match the lattice constant of the Si:C. However, in the structure of the invention, the lattice structure of the Si layer will tend to match the lattice structure of the Si:C. By virtue of the lattice matching of the Si (which normally is larger) to the Si:C island, the Si layer is placed under a compressive stress. That is, similar to the occurrence with the SiGe, the surrounding areas of the Si:C island will try to obtain an equilibrium state thus resulting in a compressive stress of an epitaxial Si sidewall layer formed on the Si:C. This area will act as a strained channel for the pFET. In one embodiment, as deposited, the C content may be up to about 4% in ratio to the Si content.

The structure formed, as shown in FIG. 13, is an intermediate structure that accommodates formation of semiconductor devices, such as pFETs and nFETs, in accordance with the principles of the invention. To form the final device, CMOS processes may be performed to form n and p finFET devices on the structure, as is well known in the finFET art. For example, the devices may include ion implantation of source and drain regions separated by the semiconducting channel of strained SiGe and Si:C. That is, the nFET will be formed over the tensilely strained channel and the pFET will be formed over the compressively strained Si channel. A gate dielectric is provided atop the strained channel, and a gate conductor is provided on top of the gate dielectric.

While the invention has been described in terms of embodiments, those skilled in the art will recognize that the invention can be practiced with modification within the spirit and scope of the appended claims. For example, the invention can be readily applicable to bulk substrates.

What is claimed is:

1. A method of manufacturing a structure, comprising the steps of:

forming a first island of material having a first lattice constant;

forming a second island of material having a second lattice constant;

providing a mask over the first island and the second island which is used to form a tensile capping layer; and forming at least a first finFET and a second finFET from the first island and the second island, wherein the tensile capping layer prevents buckling of one of the first and second finFET.

2. The method of claim 1, wherein the first island is comprised of SiGe material and the second island is comprised of Si:C material and the mask is a nitride hard mask.

3. The method of claim 1, wherein the first and second finFET are formed by sidewall image transfer and etching.

4. The method of claim 1, further comprising selectively growing an Si epitaxial sidewall layer on sidewalls of the first finFET and the second finFET, wherein the tensile capping layer prevents buckling of the at least second finFET during the growth of the Si epitaxial sidewall layer thereon.

5. The method of claim 1, wherein:

etching forms the tensile capping layer from the mask on the first and second finFET;

the first finFET is comprised of SiGe and is placed in a tensile stress; and the second finFET is comprised of is Si:C and is placed in a compressive stress.

6. The method of claim 5, wherein the tensile capping layer prevents collapse or buckling of the Si:C finFET.

7. The method of claim 1, further comprising:

forming shallow trench isolation (STI) in a substrate;

mixing the material into the substrate to form the first island and the second island by a thermal anneal process at a pFET region and a nFET region, respectively; and wherein the STI relaxes and facilitates the relaxation of the first island and the second island.

8. The method of claim 1, wherein the first island is formed by one of depositing and growing Ge material and the second island is formed by one of depositing and growing Si:C or C material, the first island and the second island have a different relaxed crystal lattice.

9. The method of claim 4, wherein the Si epitaxial sidewall layer has a different lattice constant than the first material and the second material such that the selectively grown Si epitaxial sidewall layer will strain tensilely and compressively on the first island and the second island, respectively.

10. The method of claim 4, wherein the first finFET has a lattice constant $a \geq aSi$ and the second finFET has a lattice constant $a \leq aSi$.

11. The method of claim 1, wherein the first island is comprised substantially of SiGe and the second island is comprised substantially of Si:C and an epitaxially grown sidewall layer is grown on an etched SiGe finFET and Si:C finFET formed respectively from the SiGe island and the Si:C island, the SiGe finFET and the Si:C finFET is placed under a tensile stress and a compressive stress, respectively, by virtue of lattice matching of the epitaxially grown sidewall layer to the SiGe and Si:C finFET.

12. A method of manufacturing a semiconductor structure, comprising the steps of:

forming shallow trench isolation (STI) in a substrate with a first material;

forming a first island associated with a pFET region and a second island associated with an nFET region;

providing a hard mask in tensile stress over the pFET region and the nFET region;

forming a pFET fin and an nFET fin with a capping layer of the hard mask in the pFET region and the nFET region, respectively; and growing sidewalls on the pFET fin and the nFET fin, wherein the capping layer prevents buckling of the nFET fin during sidewall growth.

13. The method of claim 12, wherein the pFET fin is made from a material comprised from SiGe and the nFET fin is made from a material comprised from one of Si:C or C.

14. The method of claim 13, wherein the SiGe becomes tensilely strained and the Si:C becomes compressively strained and the hard mask prevents buckling of the nFET fin by substantially countering the compressive stress form by sidewall formation thereon.

15. The method of claim 12, further comprising relaxing the STI and which facilitates relaxation of the first island and the second island during the thermally annealing step.

16. The method of claim 12, wherein the sidewalls are comprised of Si which has a different lattice constant than the pFET fin and the nFET fin such that the Si sidewall will tensilely and compressively stress the pFET fin and the nFET fin, respectively.

17. A method, comprising:
   forming a structure comprising a shallow trench isolation (STI) between a first region and a second region;
   depositing an epitaxial Ge material over a surface of structure;
   providing an nFET hard mask on a portion of the Ge layer over the first region;
   etching an exposed portion of the Ge layer;
   stripping the nFET hard mask;
   depositing a Si:C or C layer over the epitaxially deposited Ge material over the second region;
   depositing a pFET hard mask on a portion of the Si:C or C layer on the first region;
   etching exposed portions of the Si:C or C layer;
   stripping the pFET mask; and
   annealing the formed structure,
   wherein during the annealing, for an nFET device, the deposited Ge layer is mixed into an underlying SOI film to form an island of substantially SiGe material and, for a pFET device, the deposited Si:C layer is mixed into the underlying SOI film forming an island of substantially Si:C material.

18. The method of claim 17, wherein the annealing takes place at about 1200° C. to 1350° C. between 1 hour and 10 hours.

19. The method of claim 17, wherein the pFET hard mask is a nitride hard mask formed using spin-on coating, CVD, plasma-assisted CVD, ultrahigh vacuum chemical vapor deposition (UHVCVD), rapid thermal chemical vapor deposition (RTCVD), or limited reaction processing CVD (LR-PCVD).

20. The method of claim 17, wherein the depositing of the Si:C or C layer is by ultrahigh vacuum chemical vapor deposition (UHVCVD), rapid thermal chemical vapor deposition (RTCVD), or limited reaction processing CVD (LR-PCVD) and other like processes.

21. The method of claim 20, wherein a thickness of the Si:C or C material is between 5 to 50 nanometers.

22. The method of claim 20, wherein the Ge layer has a percentage of Ge of less than 25% for the nFET device which does not cause defects in the structure.

23. The method of claim 22, wherein, due to the annealing, the STI relaxes and facilitates the relaxation of the SiGe island and the Si:C island.

24. The method of claim 17, wherein the SiGe island and the Si:C island have different relaxed crystal lattice which yield a substrate with small crystal islands.

25. The method of claim 24, wherein the relaxation of the SiGe island and the Si:C island improves performance as compared to blanket (SiGe or Si:C) substrates.

26. The method of claim 17, wherein the Ge layer is selectively etched using RIE, wet or dry etching.

* * * * *